United States Patent
Chen et al.

(10) Patent No.: US 11,049,793 B2
(45) Date of Patent: Jun. 29, 2021

(54) FLEXIBLE BASE DESIGN FOR CHIPSET HEAT SINK

(71) Applicant: QUANTA COMPUTER INC., Taoyuan (TW)

(72) Inventors: Chao-Jung Chen, Taoyuan (TW); Yu-Nien Huang, Taoyuan (TW); Kuen-Hsien Wu, Taoyuan (TW); Shih-I Liang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/358,250

(22) Filed: Mar. 19, 2019

(65) Prior Publication Data
US 2020/0303283 A1  Sep. 24, 2020

(51) Int. Cl.
*H01L 23/40* (2006.01)
*F28D 15/02* (2006.01)
*F28F 3/00* (2006.01)
*H01L 23/427* (2006.01)

(52) U.S. Cl.
CPC .......... *H01L 23/4006* (2013.01); *F28D 15/02* (2013.01); *F28F 3/00* (2013.01); *H01L 23/427* (2013.01); *H01L 2023/4062* (2013.01); *H01L 2023/4081* (2013.01); *H01L 2023/4087* (2013.01)

(58) Field of Classification Search
None
See application file for complete search history.

(56) References Cited

U.S. PATENT DOCUMENTS

| 5,168,348 A | 12/1992 | Chu et al. |
| 2015/0145118 A1* | 5/2015 | Lee .......... H01L 23/34 257/713 |

FOREIGN PATENT DOCUMENTS

| DE | 19520938 A1 | 12/1996 |
| JP | H01227461 A | 9/1989 |
| JP | H01245550 A | 9/1989 |

OTHER PUBLICATIONS

Extended European Search Report for EP Application No. 19188769. 4, dated Mar. 3, 2020.
Communication Pursuant to Article 94(3) in EP Application No. 19188769.4, dated Apr. 9, 2021.
JP Office Action for Application No. 2019-231159, dated Feb. 9, 2021, w/ First Office Action Summary.
TW Office Action for Application No. 108120008, dated Jun. 5, 2020, w/ First Office Action Summary.

* cited by examiner

*Primary Examiner* — Long Pham
(74) *Attorney, Agent, or Firm* — Nixon Peabody LLP

(57) ABSTRACT

A heat sink having a flexible heat sink base is disclosed in order to flex the heat sink into contact with concave heat sources. Flexibility is achieved by providing a series of concentric grooves on the heat sink base on a surface opposite the surface contacting the heat source. A central cylinder is provided at the center of the concentric grooves. A biasing device, such as a spring, exerts a force on the central cylinder to flex the heat sink base.

17 Claims, 4 Drawing Sheets

FLEXIBLE BASE DESIGN FOR CHIPSET HEAT SINK

FIELD OF THE INVENTION

This disclosure pertains to heat sinks that provide improved thermal contact with a chipset.

BACKGROUND

Heat sinks are a common thermal solution for removing heat from chipsets. In operation, heat transfer between the chipset and the heat sink is best performed by conduction. It is therefore important to keep good contact between the base of the heat sink and the chipset. Factors that influence contact status include: (1) sufficient surface flatness of the heat sink base and chipset surface; (2) using thermal interface material in the contact area between the heat sink and the chipset; and (3) appropriate loading force to maintain contact between the heat sink and the chipset.

However, chipsets may have a defect in that their surface configuration can deviate from the desired surface flatness required for intimate contact with the base of the heat sink. Even if originally manufactured with an acceptable flatness, the chipset may develop an upper surface with a concave profile. The chipset will not be flat during use because of the accumulative stress of manufacturing temperature cycles and also from stress caused by heat from the systems printed circuit board ("PCB"). A typical base for a heat sink is one formed from a good heat conducting metal, such as copper. While the copper heat sink base will maintain its flatness, the periphery (or at least some edges of the chipset) may grow to form a concave profile while the copper base of the heat sink remains flat. This growth along the periphery of the chipset will cause an air gap to form between the concave surface of the chipset (intermediate its periphery) and the flat base of the heat sink. The contact between chipset and heat sink is reduced, as well as the conduction between these elements. Thus, reduced contact between chipset and base of the heat sink reduces conductive heat transfer between the base of the heat sink and the chipset.

Thus, there is a need for an improved heat sink base that will accommodate changes in the flatness of the chip set.

SUMMARY

According to one embodiment of this disclosure, conductive heat sink bases are formed of a metal in a manner that will flex to allow the heat sink base to contour itself to the surface of the chipset with which it is associated. The metal can be selected from a highly heat conductive metal, such as copper.

According to another embodiment of this disclosure, a heat sink base is made flexible by providing a series of concentric rings in the form of valleys or depressions on the side of the heat sink base, opposite the contact side of the heat sink base with the chipset.

According to a still further embodiment of this disclosure, a heat sink base is made flexible by providing a series of concentric rings in the form of valleys or depressions on the side of the heat sink base, opposite the contact side of the heat sink base with the chipset. The heat sink base is made flexible by further providing a cylinder of heat conductive metal at the center of the concentric rings.

According to a still further embodiment of this disclosure, at least the central cylinder will remain in contact with at least one fin when the heat sink base is flexed to transfer heat by conduction between the heat sink and the fin.

According to a still further embodiment of this disclosure, the flexible heat sink base is provided with a biasing device, such as a spring, exerting force on the cylinder to cause the heat sink base to deform. The spring may be H-shaped, including a central portion having four arms extending from the central portion. Screws may be employed to align the spring, the fin and the heat sink base, and exert a force towards a chipset.

According to a still further embodiment of this disclosure, a heat sink base that is made flexible by providing a series of concentric rings in the form of valleys or depressions on the side of the heat sink base, opposite the contact side of the heat sink base with the chipset. The heat sink base is made flexible by further providing a plurality of depressions in addition to the series of concentric rings, into which depressions are placed at least one heat pipe.

In a further embodiment, a combination of a flexible heat sink, formed of a heat conductive metal in a first, flat configuration, is placed into position so as to face a source of heat, such as a concave surface of a chipset. The heat sink base is flexed without breaking, into a second, convex configuration, such that the heat sink base will more closely conform to the concave surface of the chipset in order to transfer heat by conduction between the chipset and the heat sink. A series of concentric grooves in a surface of the heat sink base opposite the surface contacting the chipset is provided with a metal cylinder at the center of the concentric grooves. The cylinder remains in contact with at least one fin in both the first and second configurations. A spring, such as an H-shaped spring, may provide a biasing force on the cylinder to flex the heat sink into the second configuration.

A method of utilizing the above-described heat sink to conductively transfer heat from the chipset to the heat sink is also described.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

DETAILED DESCRIPTION

Figure 1:
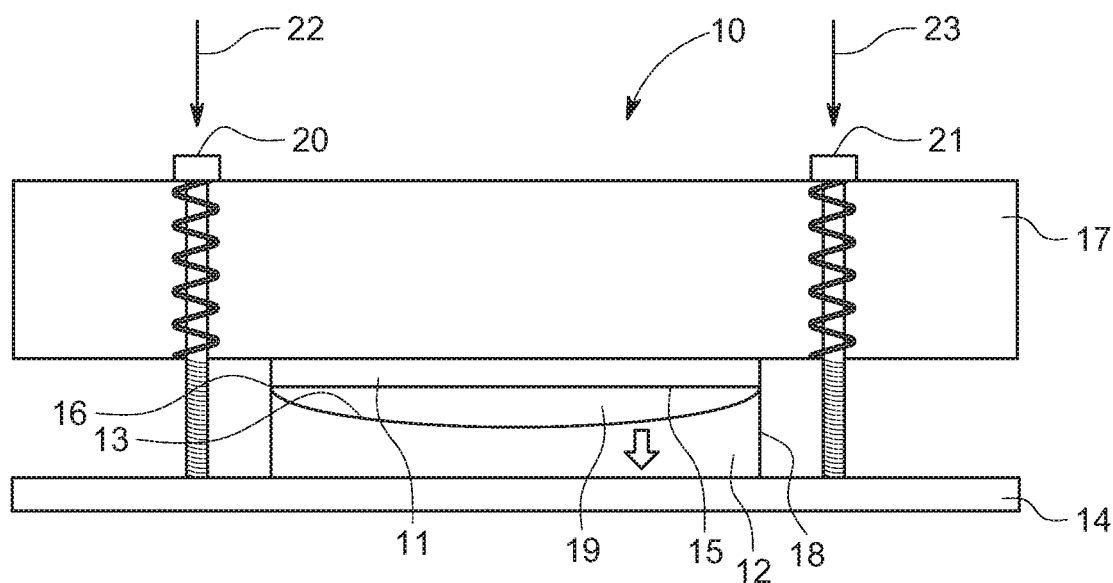
FIG. 1 (Prior Art) is a schematic illustration of a chipset that has a developed a concave profile in its upper surface and is causing an air gap to form between the chipset and the base of a heat sink.

The present inventions can be embodied in many different forms. Representative embodiments are shown in the drawings, and will herein be described in detail. These embodiments are examples or illustrations of the principles of the disclosure but are not intended to limit its broad aspects. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example. For the convenience of the reader, like elements in the various views of the drawings will be similarly numbered.

FIG. 1 (Prior Art) illustrates a typical heat sink assembly 10 in contact with a chipset 12. Chipset 12 is connected to a printed circuit board (PCB) 14. Chipset 12 may be any collection or grouping of integrated circuits, such as a switch, audio or graphics chip, the so-called north bridge and south bridge chips on a motherboard and similar devices. The specific configuration or use of the chipset is not limited by these examples. An upper surface 13 of chipset 12 was designed to be flat to contact the flat surface 15 of heat sink base 11. The heat sink base 11 is in contact with at least one fin 17 to dissipate the heat transferred to heat sink base 11. However, the stresses caused by manufacturing and use of the chipset 12 frequently cause the upper surface 13 of chipset 12 to deform, here illustrated as sides 16, 18 which have grown forming a concave upper surface 13 in chipset 12. This concave upper surface forms an air gap 19 between lower surface 15 of heat sink base 11 and the upper surface 13 of chipset 12. This air gap 19 reduces the conductive heat transfer between chipset 12 and heat sink base 11, thereby reducing the overall thermal cooling of heat sink assembly 10. Screws 20, 21 provide a loading force in the direction of arrows 22, 23. However, the loading force cannot overcome the air gap created between heat sink base 11 and chipset 12. Further, increasing the loading force might damage chipset 12.

Figure 2:
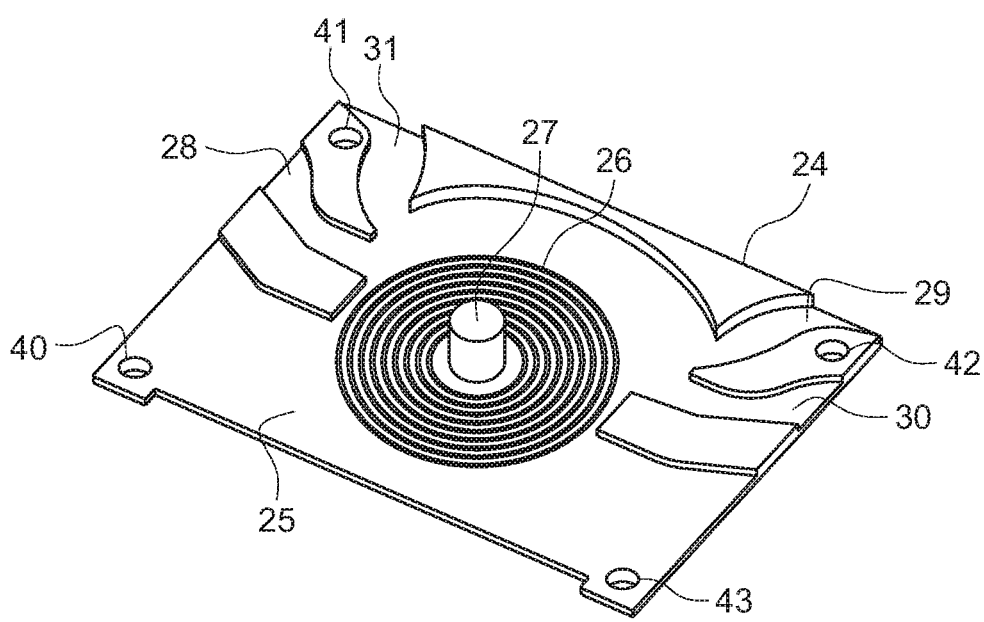
FIG. 2 is a schematic, perspective view of a heat sink base formed according to the present disclosure.

FIG. 2 is a perspective view of a heat base 24, according to the present disclosure. Heat base 24 may be formed of a highly heat conductive metal having a heat conductivity in the range of 0.50-0.99 (cal/sec)/(cm² C/cm), such as copper and aluminum, in a manner similar to the materials used as heat sinks in the past. Here however, the metal is provided with a series of concentric grooves 26 in the surface 25 opposite the surface intended to contact the chipset 12. A metal cylinder 27 is provided at the center of the series of concentric grooves 26. Metal cylinder 27 is formed of a highly heat conductive metal such as copper, and in one embodiment, is integral with heat base 24. A plurality of depressions 28, 29, 30, 31 may also be formed in surface 25 of heat base 24 to accommodate heat pipes 32, 33, 34, 35 (shown in FIG. 6). A plurality of apertures 40, 41, 42, 43 are provided in heat base 24 to accommodate fasteners, such as screws (as described below).

Figure 3:
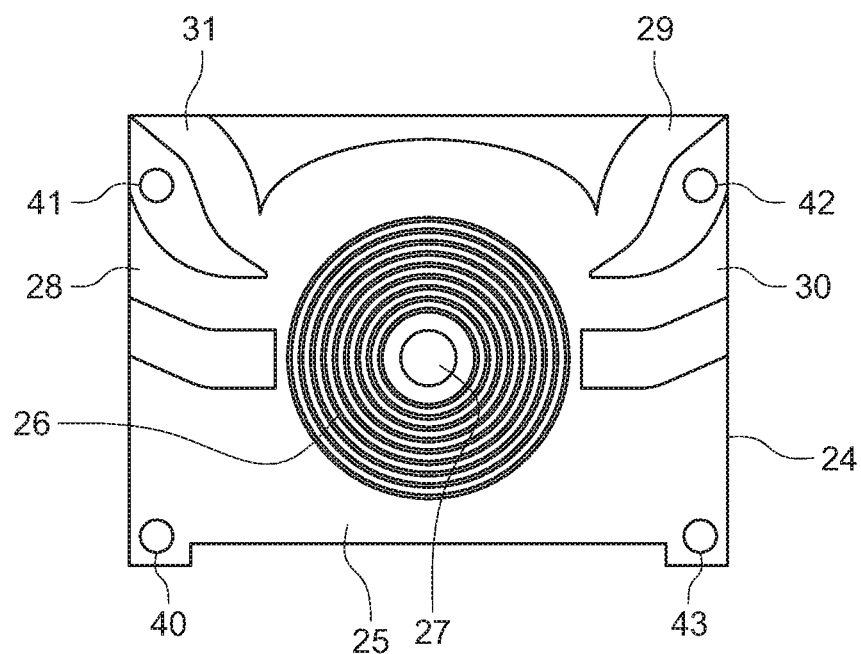
FIG. 3 is a top view of FIG. 2.

In the top view of heat base 24, illustrated in FIG. 3, the relationship between the series of concentric grooves 26 and the plurality of depressions 28, 29, 30, 31 is made clear. The depressions 28, 29, 30, 31 occupy a large portion of heat base 24 so as to accommodate the heat pipes 32, 33, 34, 35 for heat transfer. Central metal cylinder 27 is also illustrated in relation to the series of concentric grooves 26. While we have illustrated nine concentric grooves in the series of concentric grooves 26, the number of such concentric grooves may be lesser or greater than nine—provided that the function and purpose of the number of grooves allows the heat sink base 24 to flex as described below.

Figure 4:
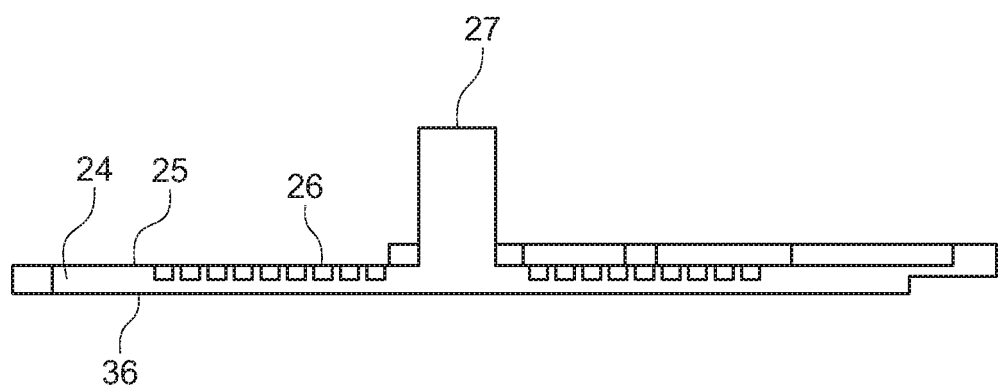
FIG. 4 is a side view, in cross-section, of FIG. 3.

FIG. 4 illustrates, in side view, the cross-sectional shape of the series of grooves 26. Grooves 26 do not extend to the lower surface 36 of heat sink base 24 such that lower surface 36 comprises an uninterrupted surface of highly heat conductive metal. Lower surface 36 of heat sink base 24 is designed to come into contact with chipset 12. While we have illustrated the concentric series of grooves 26 having a quadrilateral shape, such is by way of example only. The groove shape and depth may be of any shape and depth provided that the function and purpose of the series of concentric grooves 26 allows the lower surface 36 of heat sink base 24 to be continuous and uninterrupted and flex as described below.

Figure 5:
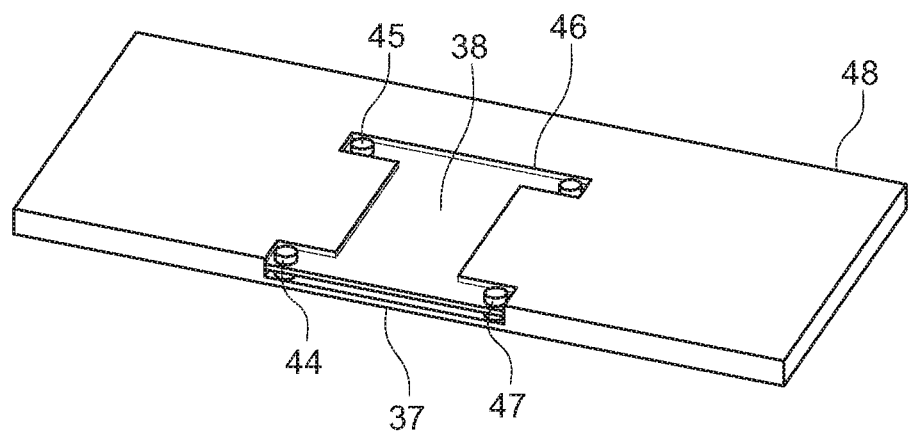
FIG. 5 is a perspective view of a metal spring to provide a biasing force on the heat sink base of FIG. 4.

A metal spring 37 as shown in FIG. 5 is provided to create a biasing force to flex lower surface 36 of heat sink base 24 (FIG. 4). Metal spring 37 is illustrated in the form of an H-shape, having a central portion 38 and four arms 44, 45, 46, 47, extending from the central portion 38. Each of the arms 44, 45, 46 and 47 are held against fin 48 by screws. While we have illustrated spring 37 as H-shaped, it will be readily seen by those skilled in the art that other spring shapes, such as those that can create geometric center force to press central metal cylinder 27, such as X-shaped springs and even star-shaped and other multi-armed springs can be employed to create the geometric center force to press central cylinder 27.

Figure 6:
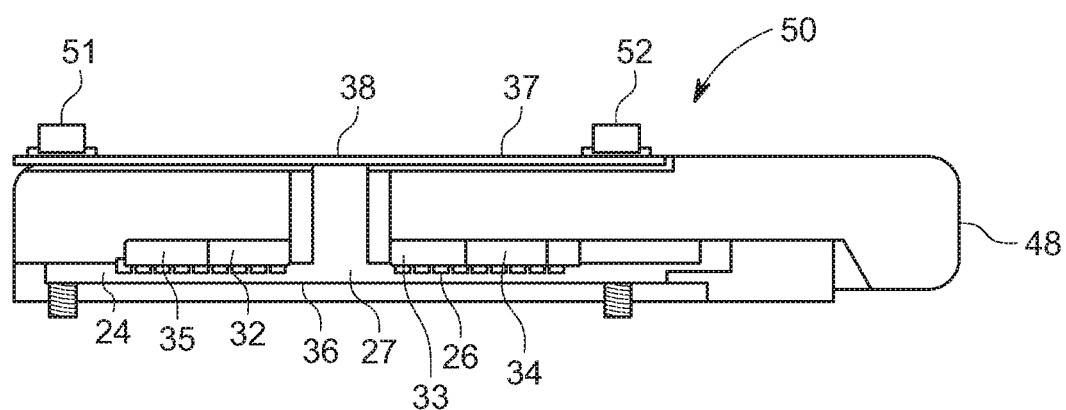
FIG. 6 is a side view in cross-section of the heat sink of the present disclosure.

FIG. 6 illustrates, in a side, cross-sectional, view the assembled heat sink 50 of the disclosure. Screws 51, 52 hold metal spring 37 in place such that the central portion 38 of spring 37 overlies the circular cylinder 27. The spring 37 will provide a bias upon circular cylinder 27 to provide an outwardly bowing of lower surface 36 of heat sink base 24. The series of concentric grooves 26 will permit the upper surface 25 of heat sink base 24 to absorb the flex of lower surface 36, without stressing the highly heat conductive metal forming the heat sink base 24 to the point of breaking. As with other heat sinks, at least one fin 48 is provided to remove heat from the heat sink by convection. It is important that the central cylinder 27 remain in contact with the at least one fin 48 in order to maintain conductive heat transfer between the heat base 24 and at least one fin 48. By maintaining the central cylinder 27 and the at least one fin 48 in contact with each other, conductive heat transfer will be maintained, even though lower surface 36 may reduce its contact with the at least one fin 48 as shown in FIG. 7.

Figure 7:
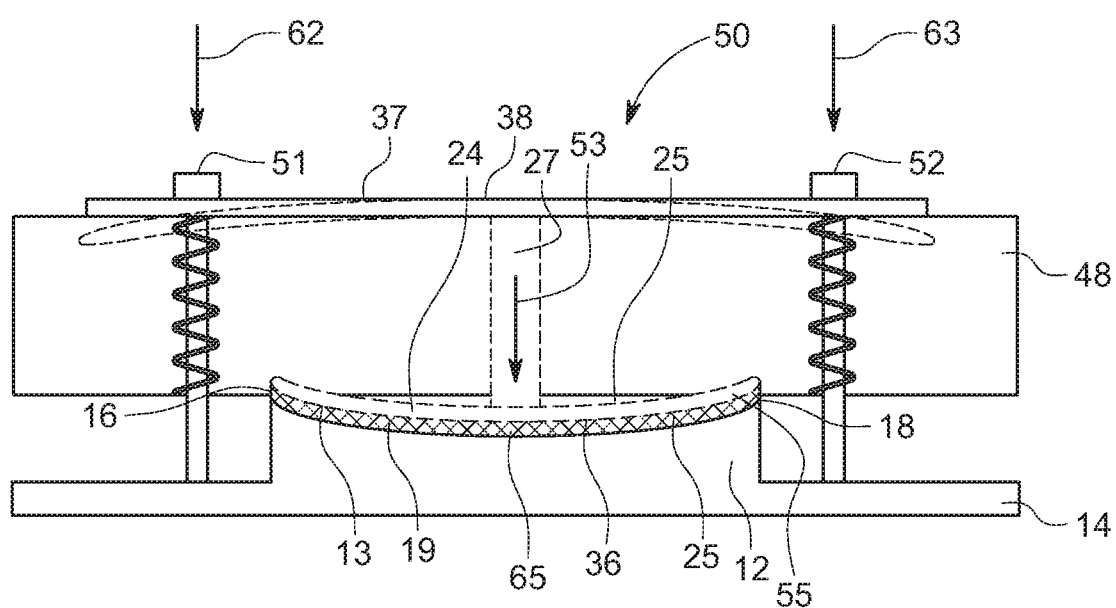
FIG. 7 is a side view of the heat sink of FIG. 6 in contact with a chipset having a concave upper surface.

FIG. 7 illustrates the heat sink 50 assembled against the chipset 12 having a concave upper surface. The screws 51, 52, when tightened provide a loading force in the direction of arrows 62, 63 against the arms 45, 46 of the H-shaped spring 37. The central portion 38 of spring 37 bears upon the central cylinder 27 imposing a downwardly directed force in the direction of arrow 53. This downwardly directed force on central cylinder 27 causes central cylinder 27 to flex the upper surface 25 as well as the lower surface 36 of heat sink base 24 to form a convex or smiley shape 55 conforming closely to the concave shape of upper surface 13 of chipset 12. The flexing of lower surface 36 of heat base 24 reduces or eliminates the air gap 19 and restores contact between heat sink base 24 and chipset 12 to promote conductive cooling. Optionally, a thermal interface material 65 may be inserted between the concave upper surface 13 of chipset 12 and the flexed surface lower surface 36 of heat sink base 24. Central cylinder 27 will remain in contact with the at least one fin 48, even when surface 25 of heat base 24 is flexed into reduced contact with the at least one fin 48 to continue to transfer heat from heat base 24 to the at least one fin 48 through central cylinder 27. The at least one fin 48 will remove heat by convective cooling, usually with the aid of at least one fan (not shown) blowing, or drawing a cooling stream of air over the at least one fin 48. The design of the at least one fin 48 is outside the scope of this disclosure as known designs of cooling fins can be substituted for the at least one fin 48.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

We claim:

1. A flexible heat sink, the heat sink comprising:
   a heat conductive metal, the metal comprising a first uninterrupted surface designed to contact a heat source and a second surface opposite the first surface; and
   the second surface being configured as a series of concentric grooves;
   the concentric grooves being configured as a plurality of valleys in the second surface;
   the number of the plurality of valleys, and a shape and a depth of each of the plurality of valleys being configured such that the first uninterrupted surface is enabled to flex into a convex shape without breaking when a directed force is applied to the second surface at the center of the series of concentric grooves in a direction towards the first uninterrupted surface, while, at the same time, allowing the second surface to flex.

2. The flexible heat sink of claim 1, further comprising a central cylinder; the central cylinder being located at the center of the concentric grooves.

3. The flexible heat sink of claim 2, wherein the central cylinder is integral with the heat conductive metal.

4. The flexible heat sink of claim 2, further comprising a spring to apply a biasing force to the central cylinder.

5. The flexible heat sink of claim 4, further comprising at least one fin in contact with the spring and the central cylinder.

6. The flexible heat sink of claim 5, further comprising a plurality of screws, each screw passing through the spring, the fin, and the heat sink.

7. The flexible heat sink of claim 2, further comprising a plurality of depressions on said second surface in addition to the series of concentric grooves.

8. The flexible heat sink of claim 7, further comprising at least one heat pipe in the plurality of depressions.

9. The flexible heat sink of claim 1, wherein the heat conductive metal comprises copper.

10. The combination of a heat source and a flexible heat sink, wherein the heat source comprises a concave upper surface; and the flexible heat sink comprises:
    a heat conductive metal, the metal comprising an uninterrupted first surface designed to contact a heat source and a second surface opposite the first surface; and
    the second surface being configured as a series of concentric grooves;
    the concentric grooves being configured as a plurality of valleys in the second surface;
    the number of the plurality of valleys, and a shape and a depth of each of the plurality of valleys being configured such that the first uninterrupted surface is enabled to flex into a convex shape without breaking when a directed force is applied to the second surface at the center of the series of concentric grooves in a direction towards the first uninterrupted surface, while, at the same time, allowing the second surface to flex.

11. The combination of claim 10, wherein the first uninterrupted surface is flat in a first configuration and convex in a second configuration.

12. The combination of claim 11, wherein the heat source is a chipset.

13. The combination of claim 11, further comprising at least one fin, the at least one fin remaining in contact with a central cylinder when the first surface is in the second configuration.

14. The combination of claim 13, further comprising a spring to bias the central cylinder and cause the first surface to enter the second configuration.

15. The combination of claim 14, wherein the spring is H-shaped, comprising four arms connected to a central portion, and the central portion is in contact with the central cylinder.

16. A method for conductively transferring heat from a chipset to a heat sink; wherein the chipset has a concave upper surface and the heat sink has a flexible surface, the method comprising:

provenance a heat sink comprising a heat conductive metal, the metal comprising an uninterrupted first surface designed to contact a heat source and a second surface opposite the first surface; and the second surface being configured as a series of concentric grooves;

the concentric grooves being configured as a plurality of valleys in the second surface;

the number of the plurality of valleys, and a shape and a depth of each of the plurality of valleys being configured such that the first uninterrupted surface is enabled to flex into a convex shape without breaking when a directed force is applied to the second surface at the center of the series of concentric grooves in a direction towards the first uninterrupted surface, while, at the same time, allowing the second surface to flex;

the heat sink further comprising a central cylinder; the central cylinder being located at the center of the concentric grooves;

applying a biasing force on the central cylinder thereby flexing the first uninterrupted surface of the heat sink into a convex shape so as to contact the concave upper surface of the chipset, and transfer heat between the chipset and the heat sink by conduction.

17. The method of claim 16, further comprising providing a spring as the biasing force.

* * * * *